US007994549B2

(12) United States Patent
Kim et al.

(10) Patent No.: US 7,994,549 B2
(45) Date of Patent: Aug. 9, 2011

(54) OPTICAL DEVICE INCLUDING GATE INSULATOR WITH MODULATED THICKNESS

(75) Inventors: Hyun-Soo Kim, Daejeon (KR); Jeong-Woo Park, Daejeon (KR); Bongki Mheen, Daejeon (KR); Gyungock Kim, Daejeon (KR)

(73) Assignee: Electronics & Telecomunications Research Institute, Daejeon (KR)

( * ) Notice: Subject to any disclaimer, the term of this patent is extended or adjusted under 35 U.S.C. 154(b) by 8 days.

(21) Appl. No.: 12/375,343

(22) PCT Filed: Apr. 24, 2007

(86) PCT No.: PCT/KR2007/002003

§ 371 (c)(1),
(2), (4) Date: Jan. 27, 2009

(87) PCT Pub. No.: WO2008/013358

PCT Pub. Date: Jan. 31, 2008

(65) Prior Publication Data

US 2009/0237770 A1 Sep. 24, 2009

(30) Foreign Application Priority Data

Jul. 28, 2006 (KR) ........................ 10-2006-0071656

(51) Int. Cl.
*H01L 29/76* (2006.01)

(52) U.S. Cl. .................. 257/288; 257/84; 257/E29.255; 359/276; 359/279

(58) Field of Classification Search .................. 359/276, 359/279; 257/288, 84, E29.255
See application file for complete search history.

(56) References Cited

U.S. PATENT DOCUMENTS

| | | | | |
|---|---|---|---|---|
| 5,399,885 | A | 3/1995 | Thijs et al. | |
| 5,684,308 | A | 11/1997 | Lovejoy et al. | |
| 6,513,993 | B1 | 2/2003 | Nakanishi et al. | |
| 6,768,174 | B2 * | 7/2004 | Hasegawa et al. | 257/350 |
| 6,801,676 | B1 | 10/2004 | Liu | |
| 7,116,847 | B2 | 10/2006 | Liu et al. | |
| 2005/0286851 | A1 | 12/2005 | Liu et al. | |

FOREIGN PATENT DOCUMENTS

| | | |
|---|---|---|
| JP | 05-074809 | 3/1993 |
| KR | 100249011 B1 | 12/1999 |
| KR | 1020020048708 A | 6/2002 |
| KR | 1020060034926 A | 4/2006 |

OTHER PUBLICATIONS

Ansheng Liu et al., "A high-speed silicon optical modulator based on a metal-oxide-semiconductor capacitor," Nature, Feb. 12, 2004, pp. 615-618, vol. 427.
Qianfan Xu et al., "Micrometre-scale silicon electro-optic modulator," Nature, May 19, 2005, pp. 325-327, vol. 435.
PCT International Search Report for App. No. PCT/KR2007/002003 filed Apr. 24, 2007.
PCT Written Opinion of the International Searching Authority for App. No. PCT/KR2007/002003 filed Apr. 24, 2007.
P. Dainesi et al., "Fast and Efficient Light Intensity Modulation in SOI with Gate-All-Around Transistor Phase Modulator," 2005 Conference on Lasers & Electro-Optics (CLEO), pp. 110-112.

* cited by examiner (Continued)

*Primary Examiner* — Tan N Tran

(57) ABSTRACT

Provided is an optical device with improved phase shift and propagation loss of light without decreasing the dynamic characteristics of the optical device. The optical device includes a first semiconductor layer which is doped with a first type of conductive impurities and has a uniform thickness; a gate insulating layer which has a 凹 shape and is formed on a portion of the first semiconductor layer and has a thin center portion; and a second semiconductor layer which covers an upper surface of the gate insulating layer and is doped with a second type of conductive impurities opposite to the first type of conductive type impurities.

16 Claims, 13 Drawing Sheets

OPTICAL DEVICE INCLUDING GATE INSULATOR WITH MODULATED THICKNESS

TECHNICAL FIELD

The present invention relates to an optical device used in optical communications, and more particularly, to an optical device including a gate insulating layer having modulated thickness, for example, an optical phase shifter or an optical attenuator.

BACKGROUND ART

Internet-based optical communications allow for transmissions of data with high speed and at large capacity. Also, recently, attempts have been made to use optical communications for large capacity computers and near distance communications.

In optical communications, data can be transmitted with high speed and at large capacity due to the possibility of simultaneous transmission of multiplexed optical signals along one optical path. Examples of core devices used in wavelength division multiplexing (WDM) for optical communications are light sources having a single wavelength, optical modulators, variable optical attenuators (VOAs), optical receivers, and optical switches. In particular, optical modulators, VOAs, and optical switches are frequently used in optical phase shifters. Accordingly, the optical phase shifter is very important for manufacturing an optical device. To manufacture an optical device with low costs, silicon is processed in a large surface using conventional techniques.

An example of a high speed optical device is a phase shifter using a variation in a refractive index obtained by a microelectronic mechanical systems (MEMS) technique or a variation in a reflective index obtained by a thermal variation. However, this optical device has an operating speed of several KHz to several MHz, and thus cannot achieve data transmission rates higher than 1 Gbps. Accordingly, an electrical-optical system which can operate at high speed has to be used in this case.

FIG. 1 is a cross-sectional view illustrating a conventional p-i-n optical device, for example, an optical phase shifter or an optical attenuator.

Referring to FIG. 1, an undoped Si slab layer 20 is formed on a whole surface of a buried oxide layer 12 formed on a silicon on insulator (SOI) substrate 10. A portion of the undoped Si slab layer 20 is removed to form an optical waveguide 30 having a rib structure as illustrated in FIG. 1. An $n^+$-ohmic layer **22*a* and a $p^+$-ohmic layer 22*b* are arranged in the slab layer 20 on both sides of the optical waveguide 30 having a rib structure, thereby the slab layer 20 forming a p-i-n structure. The ohmic layers 22*a* and 22*b* contact a wiring 24 and the wiring 24 is respectively grounded or connected to a signal voltage Vsignal. The optical waveguide 30 is covered by a protection layer 32**.

When a voltage in a forward direction is applied to the optical waveguide 30, charges 28 are formed in an optical region 26 of the optical waveguide 30, and thus the refractive index and the absorption coefficient of the optical waveguide 30 vary. However, since the dynamic characteristics of the p-i-n structured optical device are determined by the diffusion and recombination of minority carriers, the conventional p-i-n optical device has an dynamic speed of several hundreds of MHZ. Accordingly, it is difficult to use the optical device having the conventional p-i-n structure to achieve data transmission rates in the range of Gbps.

FIG. 2 is a cross-sectional view illustrating an optical device having a conventional metal-insulator-semiconductor (MIS) structure, for example, an optical phase shifter or an optical attenuator. The conventional optical device having the MIS structure is disclosed in detail in U.S. Pat. No. 6,801,676 to A. Liu et al.

Referring to FIG. 2, an n-type Si slab layer 50 is formed on a whole surface of a buried oxide layer 12 formed on an SOI substrate 10. A flat $SiO_2$ gate insulating layer 60 having a width W is formed on a portion of the Si slab layer 50, and a current blocking layer 64 is formed on the slab layer 50 on both sides of the $SiO_2$ gate insulating layer 60. The gate insulating layer 60 and the current blocking layer 64 are covered by a p-type Si upper layer or a polysilicon layer 62. The current blocking layer 64 is formed of $SiO_2$ (refractive index=1.46) and thus has a lower refractive index than Si (refractive index=3.48) for blocking a current in a horizontal direction and guiding light. A pair of impurity regions 66 are formed in an upper portion of the polysilicon layer 62, and a second wiring 68 is formed on the impurity regions 66 for applying a signal voltage Vsignal. The $n^+$-ohmic layer **52*a* or 52*b* in both upper sides of the slab layer 50 respectively contact first wirings 54** that are each grounded.

The impurity regions 66 are each a $p^+$-type ohmic layer, and when a positive voltage is applied to the $p^+$-type ohmic layer and a ground and negative potential is applied to the $n^+$-type ohmic layer, a charged layer 58 of about 10 nm is formed on upper and lower surfaces of the gate insulating layer 60. The width of the gate insulating layer 60 is W, and the charged layer 58 is mainly included in an optical region 56. The charged layer 58 is formed of various charges, for example, holes **58*a* and electrons 58*b*, which accumulate on the opposite sides of the gate insulating layer 60**.

FIG. 3 illustrates an optical mode distribution of the optical device of FIG. 2. The buried oxide layer 12 is formed to a thickness of about 3□, the n-type Si slab layer 50 is formed to a thickness of 1.43□, the flat $SiO_2$ gate insulating layer 60 is formed to a thickness of 12 nm, and the polysilicon layer 62 and the current blocking layer 64 are formed to a thickness of about 1□. The width W of the gate insulating layer 60, that is, of the rib waveguide, is about 2.5□. In addition, the refractive index of Si is 3.48, and the refractive index of $SiO_2$ is 1.46. The illustration of the optical mode distribution is shown for a horizontal direction and a vertical direction around the gate insulating layer 60.

As illustrated in FIG. 3, the intensity of the optical mode is the highest in the center portion of the gate insulating layer 60 in a horizontal direction. In detail, the intensity of the optical mode increases from both sides of the gate insulating layer 60 toward the center portion of the gate insulating layer 60. Also, regarding the vertical direction, the intensity of the optical mode of the Si slab layer 50 contacting the center portion of the gate insulating layer 60 is the highest.

FIG. 4A is a graph illustrating the optical mode distribution cut in a section along line 4A-4A (a perpendicular direction) according to the thickness of the gate insulating layer 60. FIG. 4B is a graph illustrating the optical mode distribution in a section along line 4B-4B (a horizontal direction) according to the thickness of the gate insulating layer. Line O-O is a virtual line illustrating the center portion of the gate insulating layer. The optical mode is expressed as a normalized optical profile, and the greater the profile, the higher the optical confinement factor of the charged layer which denotes the intensity of light.

Referring to FIGS. 4A and 4B, the smaller the thickness of the gate insulating layer 60, the higher the optical confinement factor of the charged layer 58. As the optical confinement factor increases, the phase shift of light increases and propagation loss of light increases, thereby improving the performance of the optical device. Accordingly, the thickness of the gate insulating layer 60 is reduced to be thin enough to cause efficient optical phase shift and increased propagation loss of light. However, as the thickness of the gate insulating layer 60 is reduced, the cutoff frequency according to the increase capacitance decreases, and thus the dynamic characteristics of the optical device are degraded.

DISCLOSURE OF INVENTION

Technical Problem

Thus, it is required to provide an optical device with improved phase shift and increased propagation loss of light without decreasing the other dynamic characteristics of the optical device.

Technical Solution

According to an aspect of the present invention, there is provided an optical device comprising: a semiconductor substrate; an insulator disposed on the semiconductor substrate; a first semiconductor layer which is formed on the insulator, is doped with a first type of conductive impurities, and has a uniform thickness; a gate insulating layer which has a 凹shape and is formed on a portion of the first semiconductor layer and has a thin center portion; and a second semiconductor layer which covers an upper surface of the gate insulating layer and is doped with a second type of conductive impurities opposite to the first type of conductive impurities.

The optical device may use a phase shift by a variation of a refractive index ($\Delta n$) according to an increase of an optical confinement factor of the center portion of the gate insulating layer. The optical device may use an optical attenuation effect by a variation of an absorption ratio ($\Delta\alpha$) according to an increase of an optical confinement factor of the center portion of the gate insulating layer. The optical device according to the present invention may be used in a Mach-Zehnder interferometer type optical modulator, a Michelson type optical modulator, a ring resonator type optical modulator, an optical switch, a variable optical filter, and a multi-channel equalizer.

Advantageous Effects

The present invention provides an optical device with improved phase shift and increased propagation loss of light without decreasing the other dynamic characteristics of the optical device.

DESCRIPTION OF DRAWINGS

The above and other features and advantages of the present invention will become more apparent by describing in detail exemplary embodiments thereof with reference to the attached drawings in which.

BEST MODE

Figure 1:
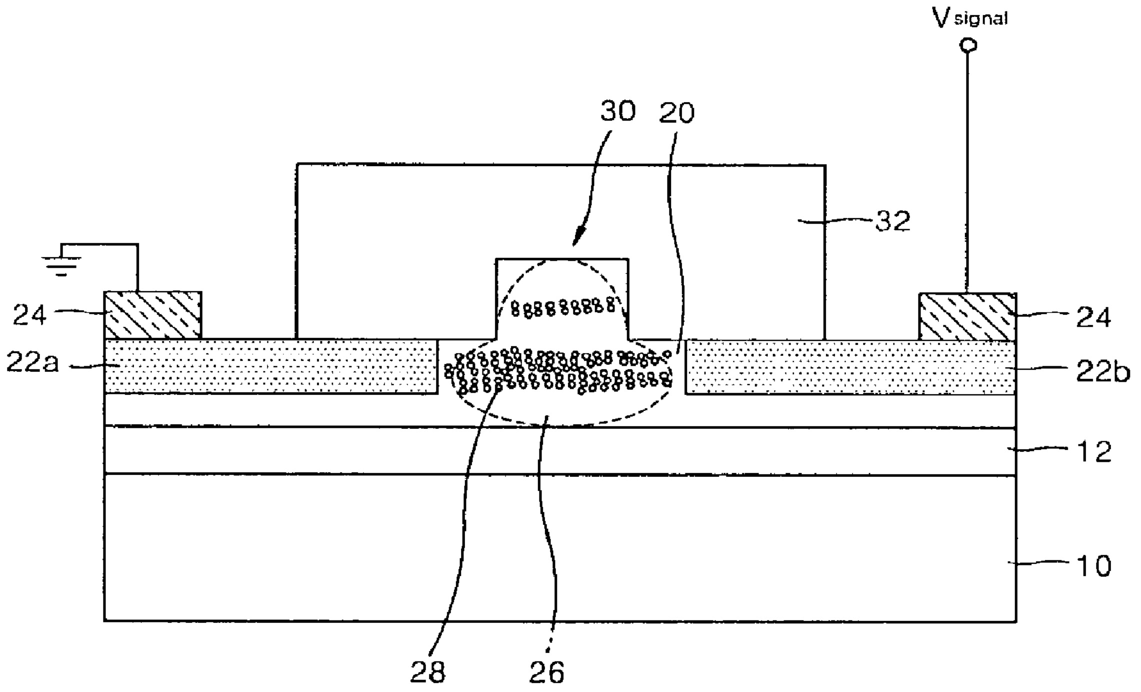
FIG. 1 is a cross-sectional view of an optical device having a conventional p-i-n structure.

The present invention will now be described more fully with reference to the accompanying drawings, in which exemplary embodiments of the invention are shown.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements.

Hereinafter, a variable optical phase shifter and a variable optical attenuator having a metal-insulator-semiconductor (MIS) structure based on a silicon semiconductor will be described as examples. In particular, a gate insulating layer according to an embodiment of the present invention has varying thickness in a horizontal direction. Compared to a flat gate insulating layer having identical capacitance, the gate insulating layer of the present invention has increased optical confinement factor of a charged layer around the gate insulating layer and concentrates the charged layer around the center portion of the rib waveguide. Accordingly, the optical device according to the present invention can increase the variation of the refractive index or optical attenuation effect without a reduction of its dynamic characteristics. The optical device according the present invention can be used for a high speed optical modulator, a high speed optical switch, and a high speed variable optical attenuator. In particular, the optical device according to the present invention can be used for a complementary MIS process based on silicon. Accordingly, wafers of a large surface area can be manufactured, thereby producing low-cost optical devices.

The density of the charged layer accumulated in the gate insulating layer, for example, a gate oxide layer, is given by Equation (1) below:

$$\Delta N_e = \Delta N_h = \frac{\varepsilon_o \varepsilon_r}{e t_{ox} t}[V_D - V_{FB}], \qquad \text{Equation (1)}$$

where $\Delta N_e$ and $\Delta N_h$ are respectively the charged density of an electron and a hole, e is an electronic charge constant, $\epsilon_O$ and $\epsilon_r$ are the vacuum permittivity of the oxide layer and the low-frequency relative permittivity, $t_{ox}$ is the thickness of the gate insulating layer, t is an effective charged layer thickness, $V_D$ is a driving voltage, and $V_{FB}$ is a flat band voltage. Here, t is about 10 nm, and $V_{FB}$ is 1.25 V.

The capacitance of the gate insulating layer in the MIS structure and the cutoff frequency $f_{cutoff}$ which denotes the dynamic characteristics are expressed according to Equations (2) and (3).

$$C_{ox} = \frac{\varepsilon_o \varepsilon_r}{t_{ox}} \qquad \text{Equation (2)}$$

$$f_{cutoff} \cong \frac{1}{2\pi R C_{ox}}, \qquad \text{Equation (3)}$$

where $C_{ox}$ denotes the capacitance of a gate oxide, and R denotes a resistance.

A charge amount Q according to the capacitance of the gate oxide layer is calculated using Equation (4):

$$Q \approx C_{ox}(V_D - V_{FB}) \qquad \text{Equation (4)}$$

Regarding Equations (1) through (4), when the gate insulating layer is thin, the charge density accumulated at an identical voltage increases, but the cutoff frequency, which denotes the dynamic characteristics, is decreased, and thus, a high speed operation becomes difficult.

Meanwhile, the variation of the refractive index of silicon and the variation of the absorption coefficient according to the charge density in the charged layer can be defined according to Equations (5) and (6):

$$\Delta n = -\frac{e^2\lambda^2}{8\pi^2 c^2 \varepsilon_o n_o}\left(\frac{\Delta N_e}{m_e} + \frac{\Delta N_h}{m_h}\right) \qquad \text{Equation (5)}$$

$$\Delta \alpha = -\frac{e^3\lambda^2}{8\pi^2 c^3 \varepsilon_o n_o}\left(\frac{\Delta N_e}{m_e^2 \mu_e} + \frac{\Delta N_h}{m_h^2 \mu_h}\right), \qquad \text{Equation (6)}$$

where Δ n denotes the variation of silicon refractive index, $n_o$ denotes the refractive index of pure silicon, $\lambda$ denotes the light speed, l denotes a wavelength, $\mu_e$ and $\mu_h$ respectively denote the mobility of electrons and holes, and $\mu_e$ and $\mu_h$ respectively denote the effective mass of electrons and holes.

The phase shift according to the variation of charge density accumulated around the gate insulating layer by a voltage applied to the optical waveguide having a MIS structure is calculated using Equation 7. That is, the phase shift is determined by the variation of the refractive index of silicon, which is the variation of the effective refractive index of the optical waveguide having a MIS structure, and the optical confinement factor $$\Gamma_{charge} \cdot \Delta\phi = \frac{2\pi}{\lambda}\Delta n_{eff} \cdot L = \frac{2\pi}{\lambda}\Delta n \cdot \Gamma_{charge} \cdot L, \qquad \text{Equation (7)}$$

where $\Delta\phi$ denotes a phase shift, $\Delta n_{eff}$ denotes a variation of effective refractive index, $\Gamma_{charge}$ denotes the optical confinement factor of the charged layer, and L denotes the length of the MIS optical waveguide to which a voltage is applied.

The variation of the propagation loss of light Δ Loss according to the variation of the charge density accumulated around the gate oxide layer by a voltage applied in the optical waveguide of the MIS structure is as Equation (8). That is, the propagation loss of light Δ Loss is determined by the variation of the absorption coefficient of silicon and the optical confinement factor $\Gamma_{charge}$ of the charged layer.

$$\Delta Loss = \Delta\alpha \cdot \Gamma_{charge} \cdot L \qquad \text{Equation (8)}$$

The phase shift $\Delta\phi$ and the propagation loss of light Δ Loss according to the optical confinement factor $\Gamma_{charge}$ can be applied to an optical phase shifter and an optical attenuator for optical communications. Here, the phase shift $\Delta\phi$ and the propagation loss of light Δ Loss are generated simultaneously by the optical confinement factor $\Gamma_{charge}$ . In general, when the phase shift $\Delta\phi$ and the propagation loss of light Δ Loss are high, the efficiency of the optical phase shifter and the optical attenuator is improved. Accordingly, the optical confinement factor $\Gamma_{charge}$ may be high for the phase shift $\Delta\phi$ and the propagation loss of light Δ Loss to be sufficient for a predetermined length of a MIS structure used for an optical phase shifter and a variable optical attenuator.

Figure 5:
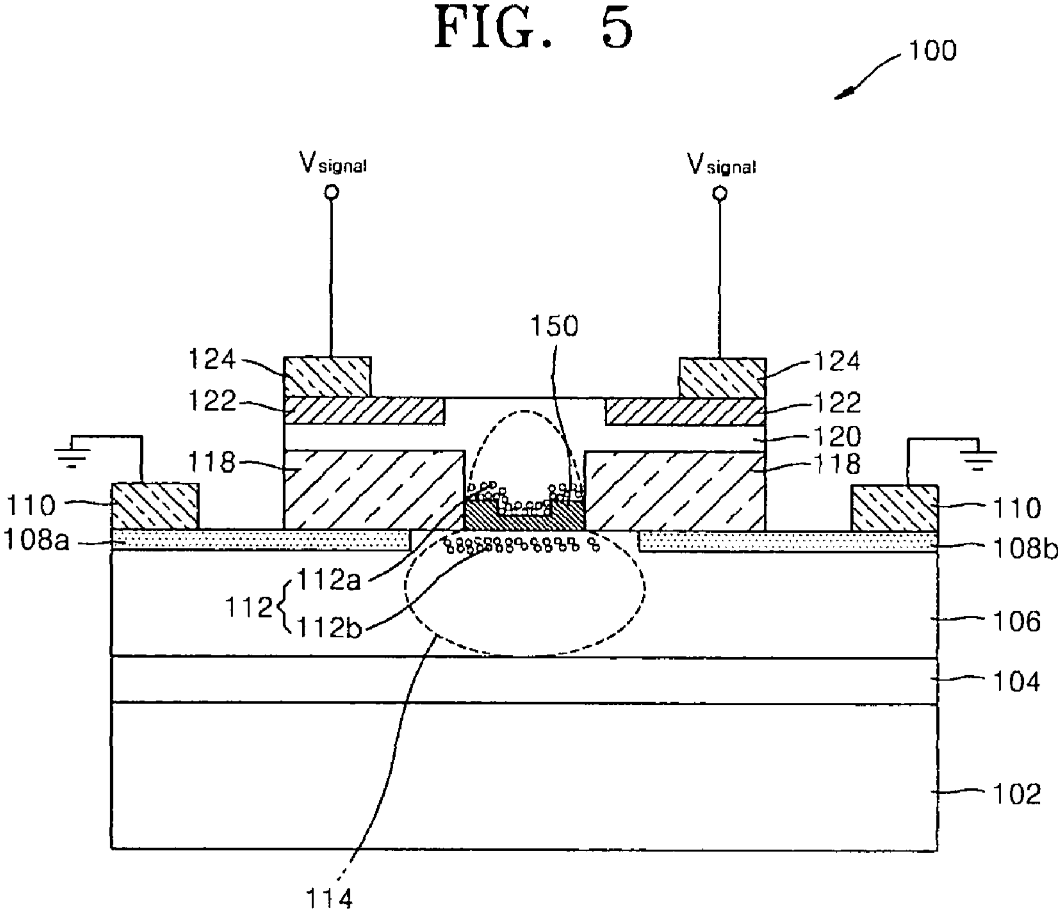
FIG. 5 is a cross-sectional view of an MIS optical device according to an embodiment of the present invention.

FIG. 5 is a cross-sectional view of an optical device 100 having an MIS structure according to an embodiment of the present invention.

Referring to FIG. 5, the optical device 100 includes an n-type Si slab layer 106 formed on a whole surface of a buried oxide layer 104 formed on a Si substrate 102. The slab layer 106 can be entirely uniformly doped or doped partially to various doping densities. A gate insulating layer 150, for example, a silicon oxide layer, which has a 凹form, the center portion of which is thin, is formed on some portions of the Si slab layer 106. A current blocking layer 118 is formed on the slab layer 106 on both sides of the gate insulating layer 150. The gate insulating layer 150 and the current blocking layer 118 are covered with a p-type Si upper layer or a silicon layer 120. The silicon layer 120 may be a combination of a polysilicon layer, a single crystal silicon layer, and an epitaxial growth silicon layer. The silicon layer 120 may be entirely uniformly doped or partially doped to various doping densities. The current blocking layer 118 is formed of $SiO_2$ (refractive index=1.46) and thus has a lower refractive index than Si (refractive index=3.48) for blocking a current in a horizontal direction and constraining light. A pair of impurity regions 122 is arranged on the polysilicon layer 120, and second wirings 124 are formed on the impurity regions 122 for applying a signal voltage $V_{signal}$. The $n^+$-ohmic layer 118*a* or 118*b* on both upper sides of the slab layer 106 contacts first wirings 110 that are each grounded.

The impurity regions 122 are each a $p^+$ type ohmic layer, and when a positive voltage is applied to the $p^+$ type ohmic layer, and a ground or negative potential is applied to an $n^+$ type ohmic layer, a charged layer 112 as illustrated on upper and lower surfaces of the gate insulating layer 150 is formed. The charged layer 112 is usually included in an optical region 114. Also, the charged layer 112 is formed of various charges, for example holes 112*a* and electrons 112*b*, which accumulate on the opposite sides of the gate insulating layer 150. The relationship between the gate insulating layer 150 and the charged layer 112 will be described with reference to FIG. 5B.

Figure 6:
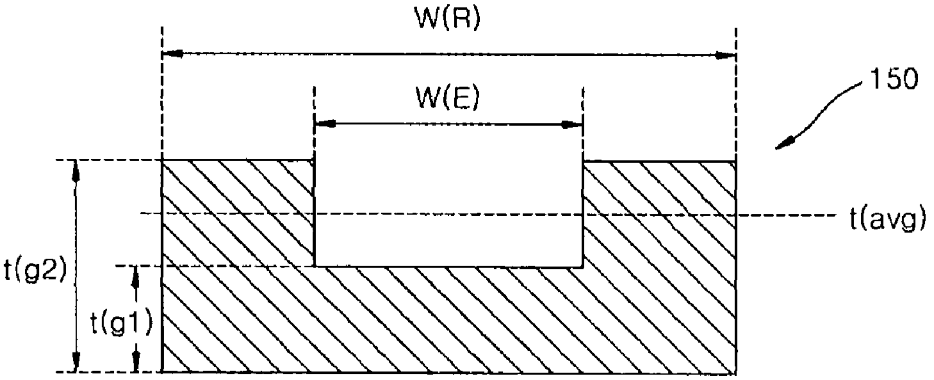
FIG. 6 is a cross-sectional view for explaining a gate insulating layer according to an embodiment of the present invention.

FIG. 6 is a cross-sectional view for explaining the gate insulating layer 150 according to an embodiment of the present invention.

As illustrated in FIG. 6, the gate insulating layer 150 has a 凹shape, the center portion of which is thin. That is, the center portion is removed by etching or the like to have a width W(E), and the total gate insulating layer identical to a rib waveguide has a width W(R). W(E) and W(R) define the duty of the gate insulating layer 150 as shown in Equation (9).

$$\text{duty} = \frac{W_{etch}}{W_{rib}} \quad \text{Equation (9)}$$

Also, the thickness of the thin portion of the gate insulating layer 150 is expressed as t(g1) and the thickness of the thick portion of the gate insulating layer 150 is expressed as t(g2). The average thickness of the gate insulating layer 150 is defined as t(avg), which is identical to thickness of the flat gate insulating layer 60 described with reference to FIG. 2.

$$t(\text{avg}) = \text{duty} \times t(g1) + (1-\text{duty}) \times t(g2) \quad \text{Equation (10)}$$

Figure 4A:
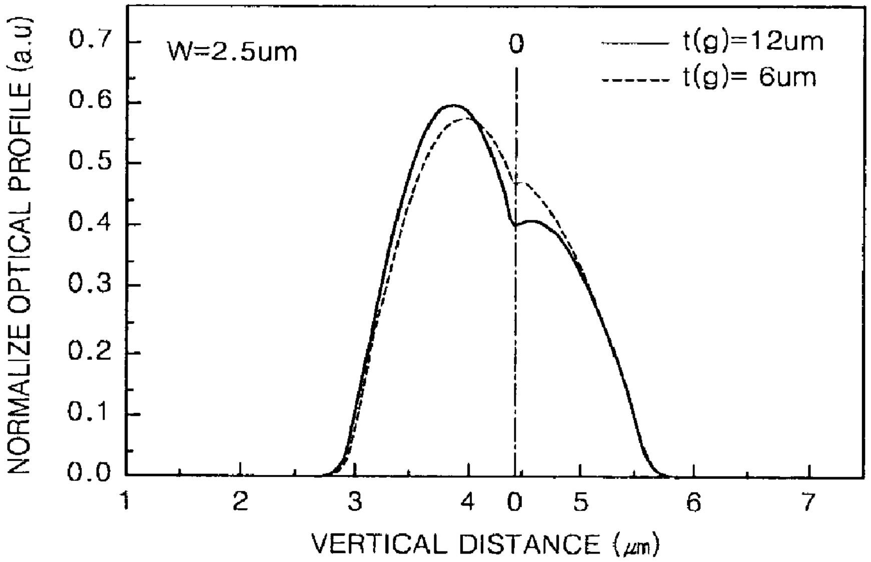
FIG. 4A is a graph illustrating the optical mode distribution in a section along line 4A-4A (a perpendicular direction) according to the thickness of the gate insulating layer.
Figure 4B:
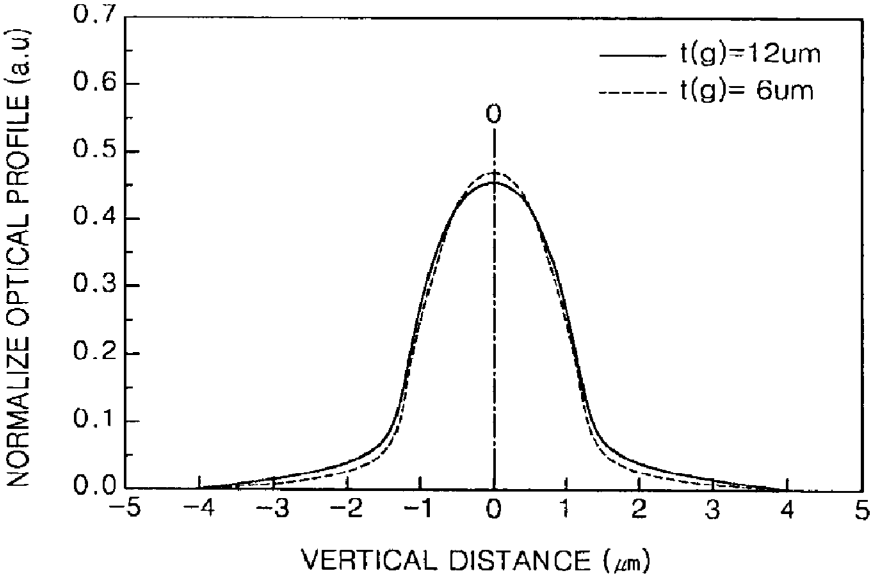
FIG. 4B is a graph illustrating the optical mode distribution in a section along line 4B-4B (a horizontal direction)

As the center portion of the gate insulating layer 150 is formed thin, the charge density of the charged layer is increased according to Equation (1). In addition, as can be seen in FIG. 4, as the center portion of the gate insulating layer 150 is formed thin, the optical confinement factor $\Gamma_{charge}$ is increased. Accordingly, the charge density of the charged layer increases and the optical confinement factor $\Gamma_{charge}$ is increased, and thus the phase shift $\Delta\phi$ and the propagation loss of light Δ Loss increase. Accordingly, the efficiency of the optical phase shifter and the optical attenuator is improved. Also, the thickness t(avg) of the average gate insulating layer is maintained to be equivalent to the thickness of the flat gate insulating layer, and thus a reduction of the dynamic characteristics of the optical device due to the reduction of a cutoff frequency is prevented.

Figure 7A:
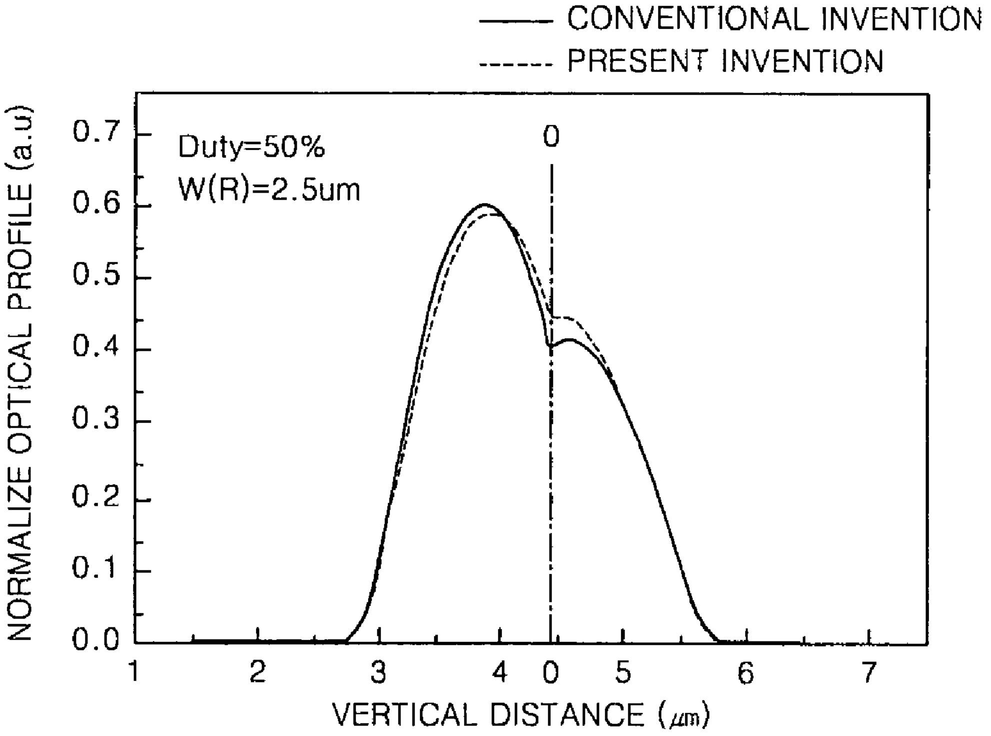
FIG. 7A is a graph for comparing the optical mode distribution of the optical device of the present invention and of the conventional optical device of FIG. 2 in a perpendicular direction.
Figure 7B:
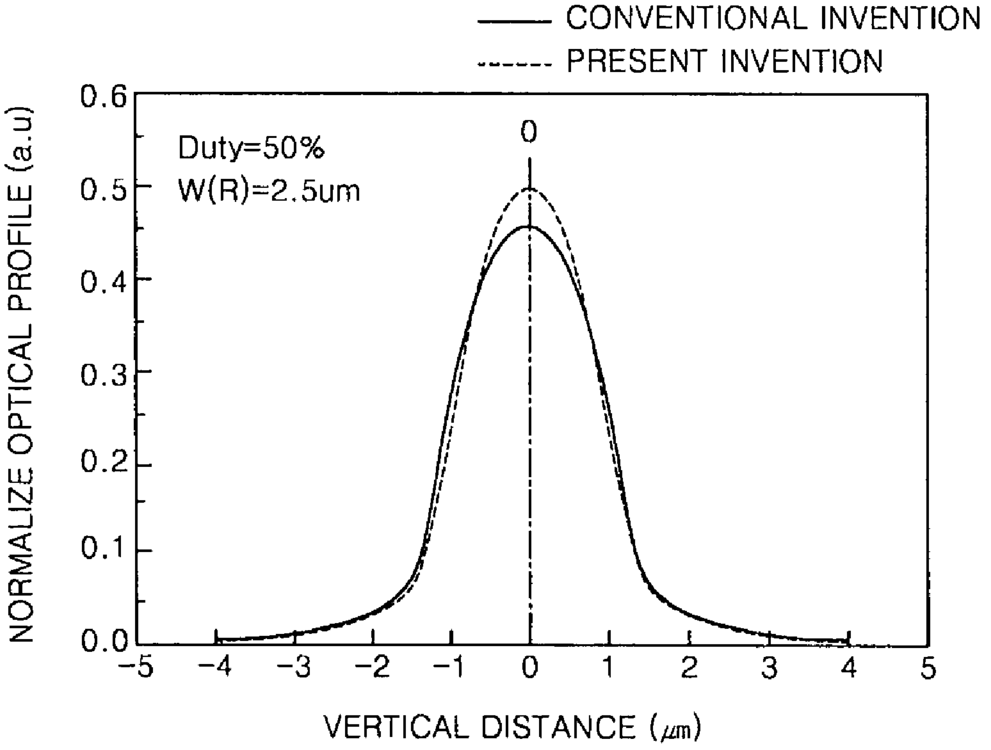
FIG. 7B is a graph for comparing the distributions of the optical modes in a horizontal direction.

FIG. 7A is a graph for comparing the optical mode distributions of the optical device of the present invention and of the conventional optical device in a perpendicular direction, and FIG. 7B is a graph for comparing the optical mode distributions of the of the optical device of the present invention and of the conventional optical device in a horizontal direction. The optical device according to the present invention and the conventional optical device have the same t(avg). t(avg) of the gate insulating layer used in the present invention is about 12 nm, t(g1) is about 6 nm, t(g2) is about 14 nm, W(R) is about 2.5□, and duty is about 50%. The thickness and the material of the rest of the structure are the same as those described with respect to FIG. 2. The distribution of the optical mode is analyzed in the same way as described with respect to FIGS. 4A and 4B.

Figure 2:
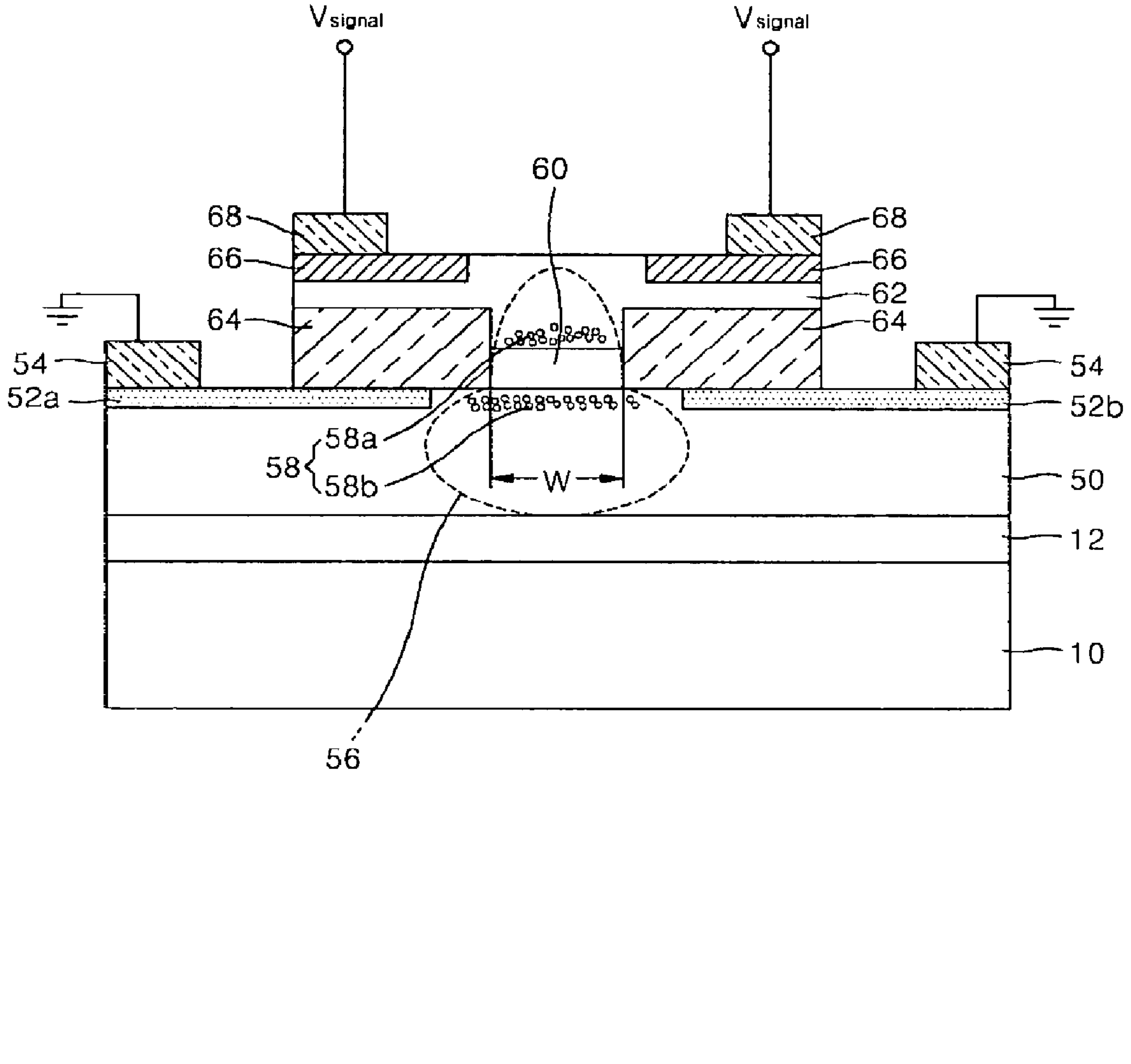
FIG. 2 is a cross-sectional view of an optical device having a conventional MIS structure.
Figure 3:
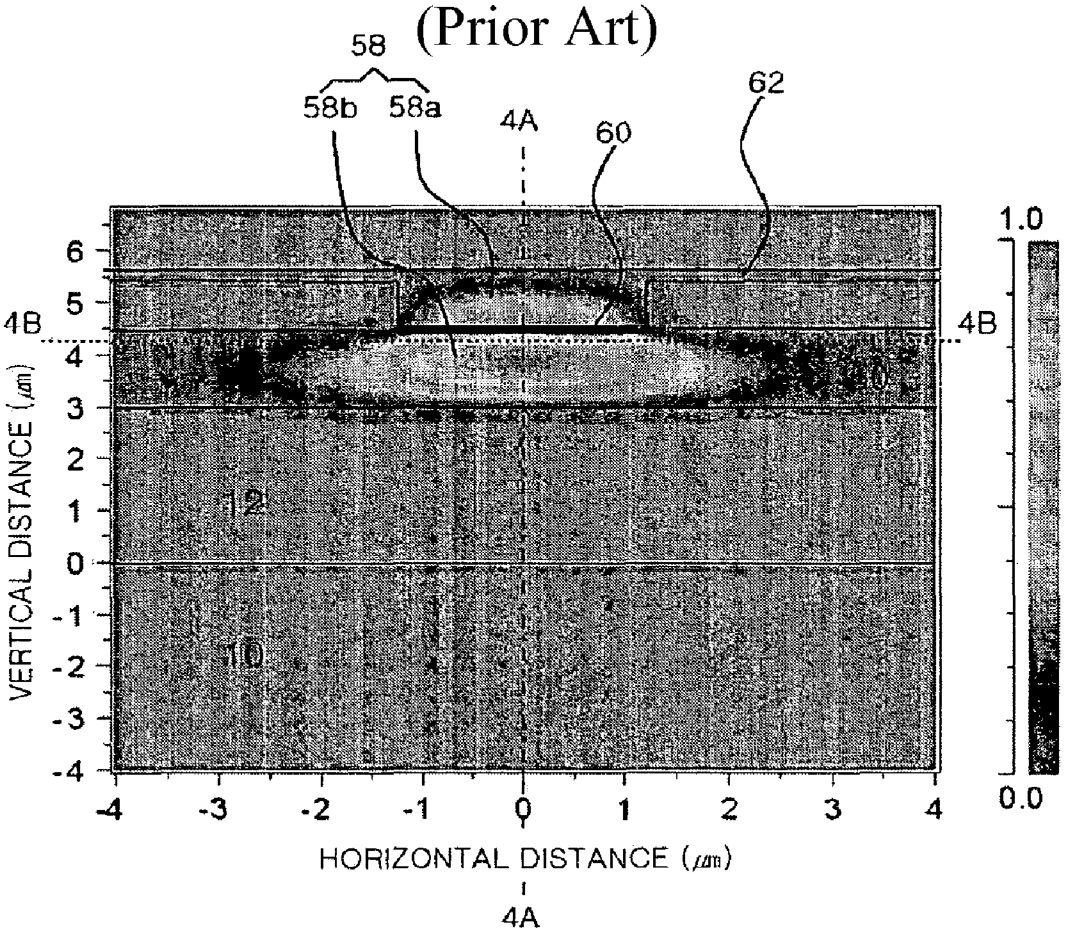
FIG. 3 is a graph illustrating the distribution of an optical mode of the optical device of FIG. 2.

Referring to FIGS. 7A and 7B, the optical confinement factor around the center portion of the gate insulating layer 150 according to the present invention is improved compared to the conventional gate insulating layer 60 in FIG. 2. In other words, the phase shift $\Delta\phi$ and the propagation loss of light Δ Loss increase in the optical device according to the present invention compared to the conventional optical device. In addition, compared to the flat gate insulating layer having the same t(avg), even though the optical device according to the present invention has the same charge amount Q when the same voltage is applied, since the center portion of the gate insulating layer in the present invention is formed thin, more charges are accumulated around the center portion of the gate insulating having greater optical confinement factor $\Gamma_{charge}$ according to Equations (2) and (4), compared to the edge of the gate insulating layer having smaller optical confinement factor $\Gamma_{charge}$. Thus the phase shift $\Delta\phi$ and the propagation loss of light Δ Loss is increased. In other words, while uniform charges are accumulated around the flat gate insulating layer when an external voltage is applied, in the present invention, more charges are accumulated around the center portion of the gate insulating layer having great optical confinement factor $\Gamma_{charge}$, thereby increasing the phase shift $\Delta\phi$ and the propagation loss of light Δ Loss.

In detail, the surface area between the axis denoting the perpendicular direction and the graph is identical. Thus, the operational characteristics of the optical device according to the cutoff frequency are maintained uniform.

Figure 8A:
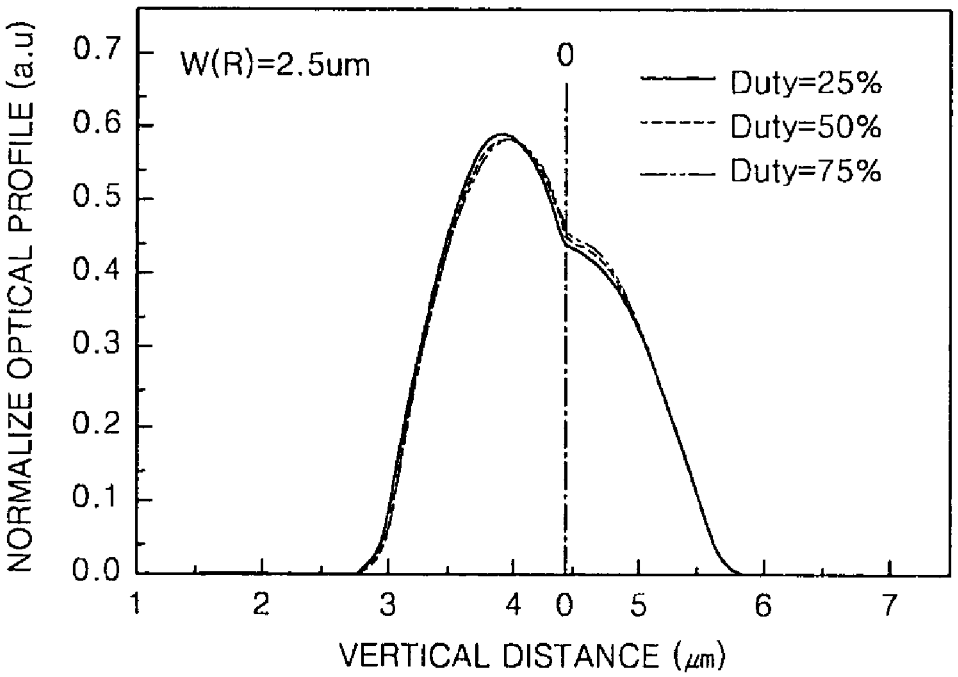
FIG. 8A is a graph illustrating the optical mode distribution in a perpendicular direction according to the variation of the duty of the gate insulating layer.
Figure 8B:
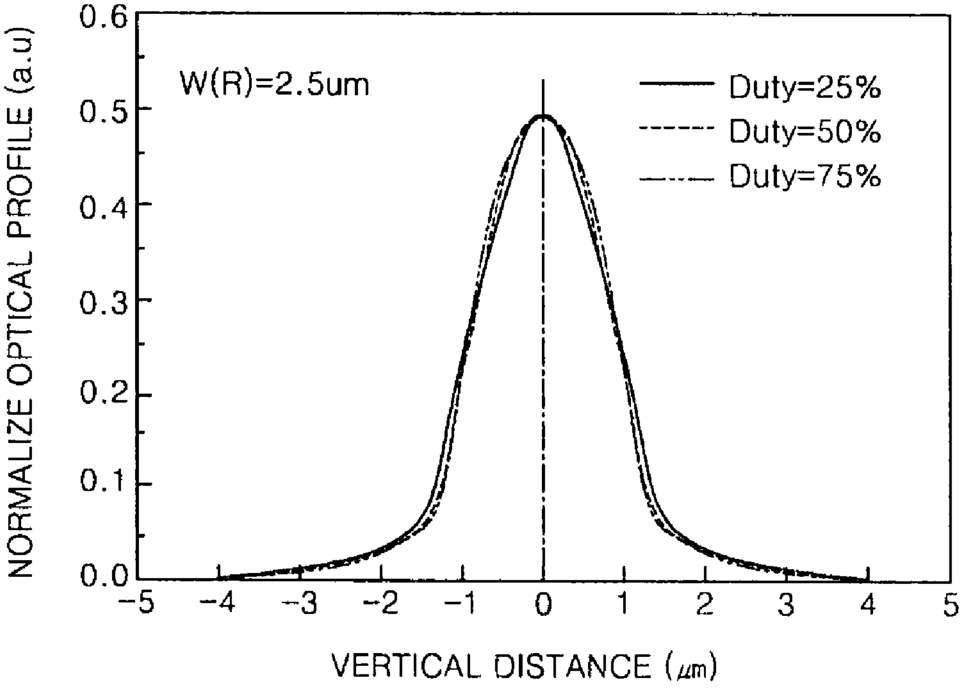
FIG. 8B is graph illustrating the optical mode distribution in a horizontal direction.

FIG. 8A is a graph illustrating the optical mode distribution in a perpendicular direction according to the variation of the duty of the gate insulating layer, and FIG. 8B is graph illustrating the optical mode distribution in a horizontal direction. The optical mode of FIGS. 8A and 8B are analyzed in the same way as the optical mode of FIGS. 7A and 7B. In addition, t(avg) is set to be about 12 nm, and t(g1) is set as about 6 nm. The other characteristics of the optical device besides the duty variation are identical to the characteristics of the optical device of FIGS. 7A and 7B.

As evident from FIGS. 8A and 8B, the greater the duty, the higher the optical confinement coefficient around the center portion of the gate insulating layer 150. In other words, when the duty is increased, W(E) of the gate insulating layer around the center portion of the rib waveguide having high optical confinement factor is increased relatively, and thus more charges are accumulated. When the duty is increased, more charges are accumulated around the center portion of the rib waveguide, and thus the phase shift $\Delta\phi$ increases and the propagation loss of light Δ Loss decreases. Here the duty may be 0.10 to 0.90.

Figure 9A:
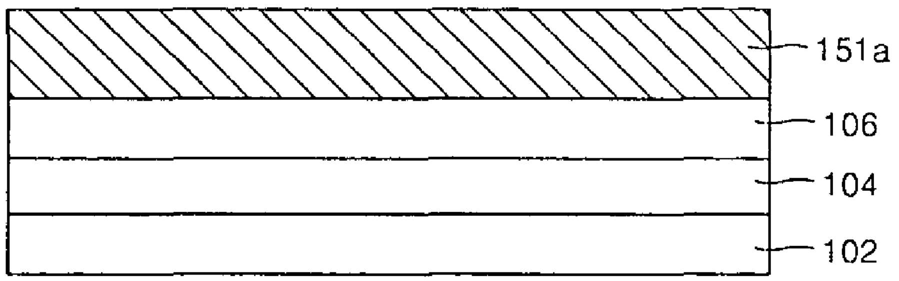
FIGS. 9A through 9C are cross-sectional views illustrating the formation of the gate insulating layer according to an embodiment of the present invention.
Figure 9B:
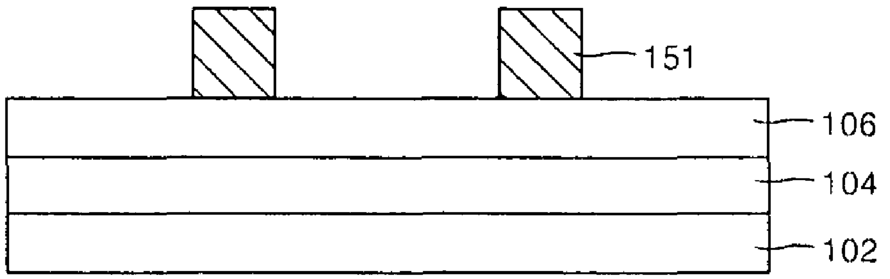
Figure 9C:
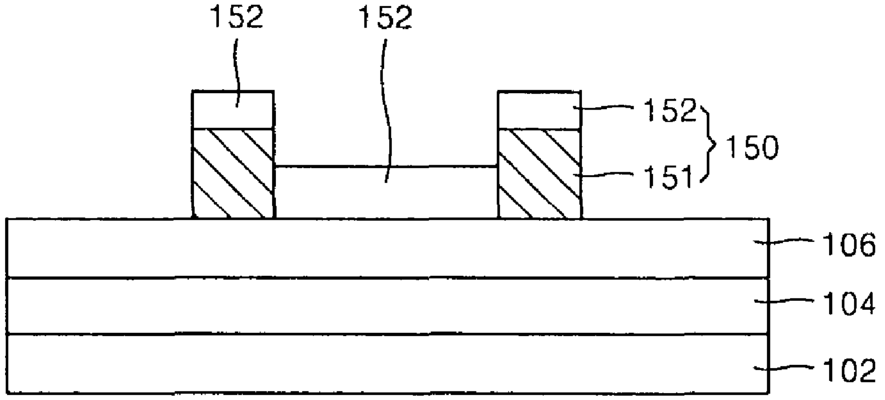

FIGS. 9A through 9C are cross-sectional views illustrating the formation of the gate insulating layer of the present invention.

Referring to FIGS. 9A through 9C, a buried oxide layer 104 is formed on a SOI substrate, that is, a Si substrate 102. Then, an n-type slab layer 105 is formed on a front surface of the buried oxide layer 104. The slab layer 106 may be doped entirely uniformly or partially with various doping densities. A first insulating layer forming layer 151*a* which forms a gate insulating layer 150 is formed on a whole surface of the n-type slab layer 106. Next, a portion of the first insulating layer formation layer 151*a* is removed using conventional photolithography or electron beam lithography to form first insulating layers 151, which are separated a predetermined distance, as a pattern.

Next, a second insulating layer 152 is formed to a uniform thickness on the slab layer 106 between the upper surface of the first insulating layer 151 and on the slab layer 106 between the first insulating layers 151. Accordingly, a gate insulating layer 150, the center portion of which is thin, is formed. The first and second insulating layers 151 and 152 may be formed of an identical material or different materials. The gate insulating layer 150 may be formed of at least one material selected from the group consisting of $SiO_2$, $H_2fO$, $SiN_x$, $SiN_xO_y$, ferroelectric material, or a combination of these materials.

Hereinafter, various applications in which the optical device of the present invention can be used will be described. The optical device of the present invention increases the phase shift $\Delta\phi$ and increases propagation loss of light Δ Loss and thus can be used in various types of optical devices and optical systems. For example, the optical device of the present invention can be used for an optical modulator, optical intensity equalizer, an optical switch, and an optical filter. The applications presented shown are only exemplary, and other various applications are possible within the range of the present invention. Thus, since the standard defining the examples below is set for convenience of explanation, the examples may also be analyzed from other various perspectives. For example, an optical switch may be used as an optical filter.

Figure 10:
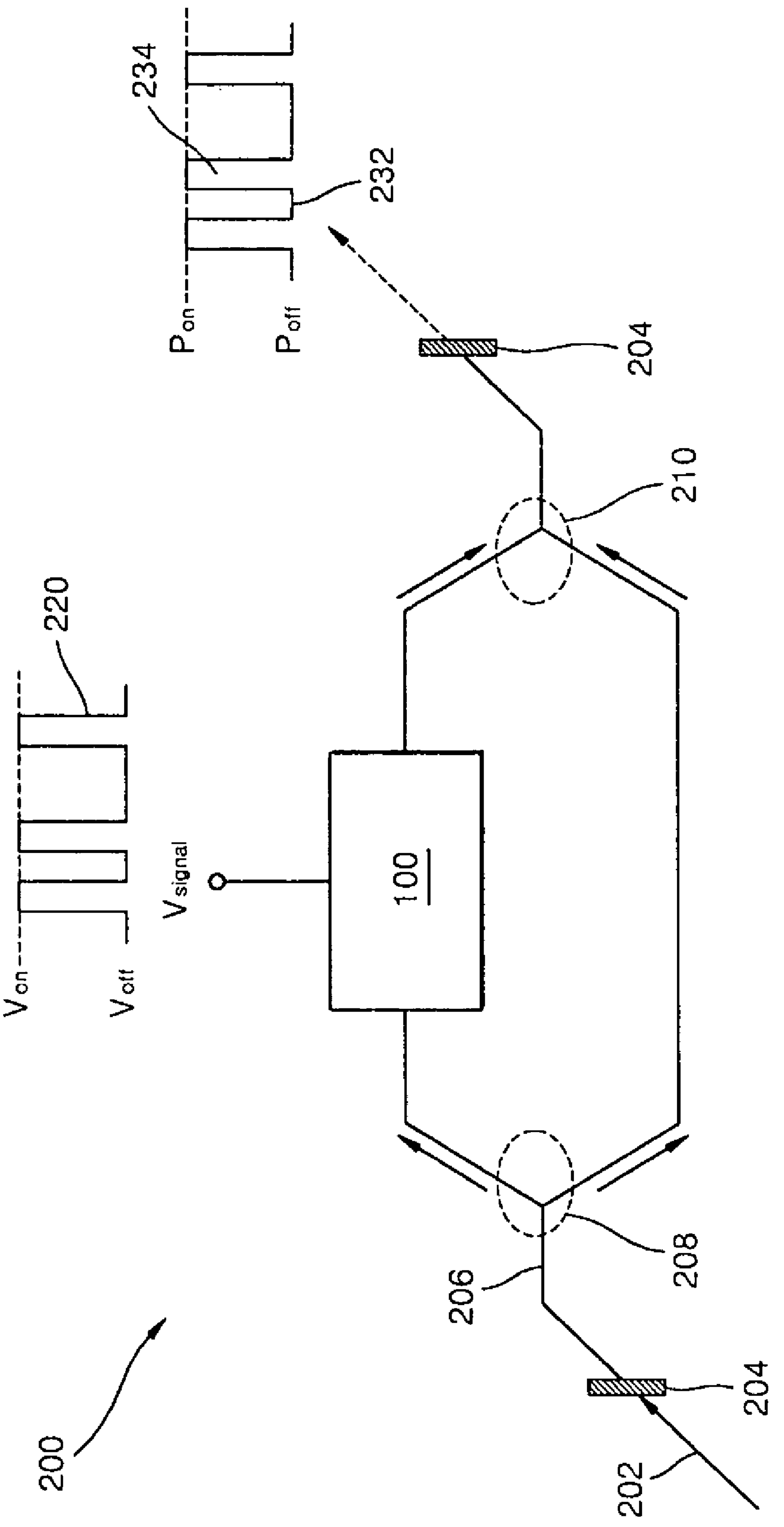
FIG. 10 is a schematic view of an optical modulator having a Mach-Zehnder structure including the optical device of the present invention.

FIG. 10 is a schematic view of an optical modulator having a Mach-Zehnder structure 200 (or Mach-Zehnder interferometer) including the optical device of the present invention.

Referring to FIG. 10, the Mach-Zehnder interferometer 200 includes a passive waveguide 206, a Y-optical intensity splitter 208, a phase shifter 100, and a Y-optical intensity combiner 210. When a continuous wave 202 having continuous optical intensity is input to the passive waveguide 206, the continuous wave 202 is branched from the Y-optical intensity splitter 208 along two arms of the Mach-Zehnder interferometer 200. A phase shifter 100 is installed in at least one of the two arms to modulate the phase of beams by a modulated applied voltage 220. The phase-shifted beam is destructive- or constructive-interfered in the Y-optical intensity combiner 210 to output optical signals 232 and 234, the optical intensity of which is modulated. The output is divided into off-state output (232; $P_{off}$) and on-state output (234; $P_{on}$).

Since an as-cleaved facet of the passive waveguide 206 is reflected due to air and the difference of the refractive index, the passive waveguide 206 may be deposited with an anti-reflection film 204. In addition, to reduce more the reflection of the waveguide 206, the anti-reflection film 204 may be inclined toward the facet of the passive waveguide 206.

Figure 11:
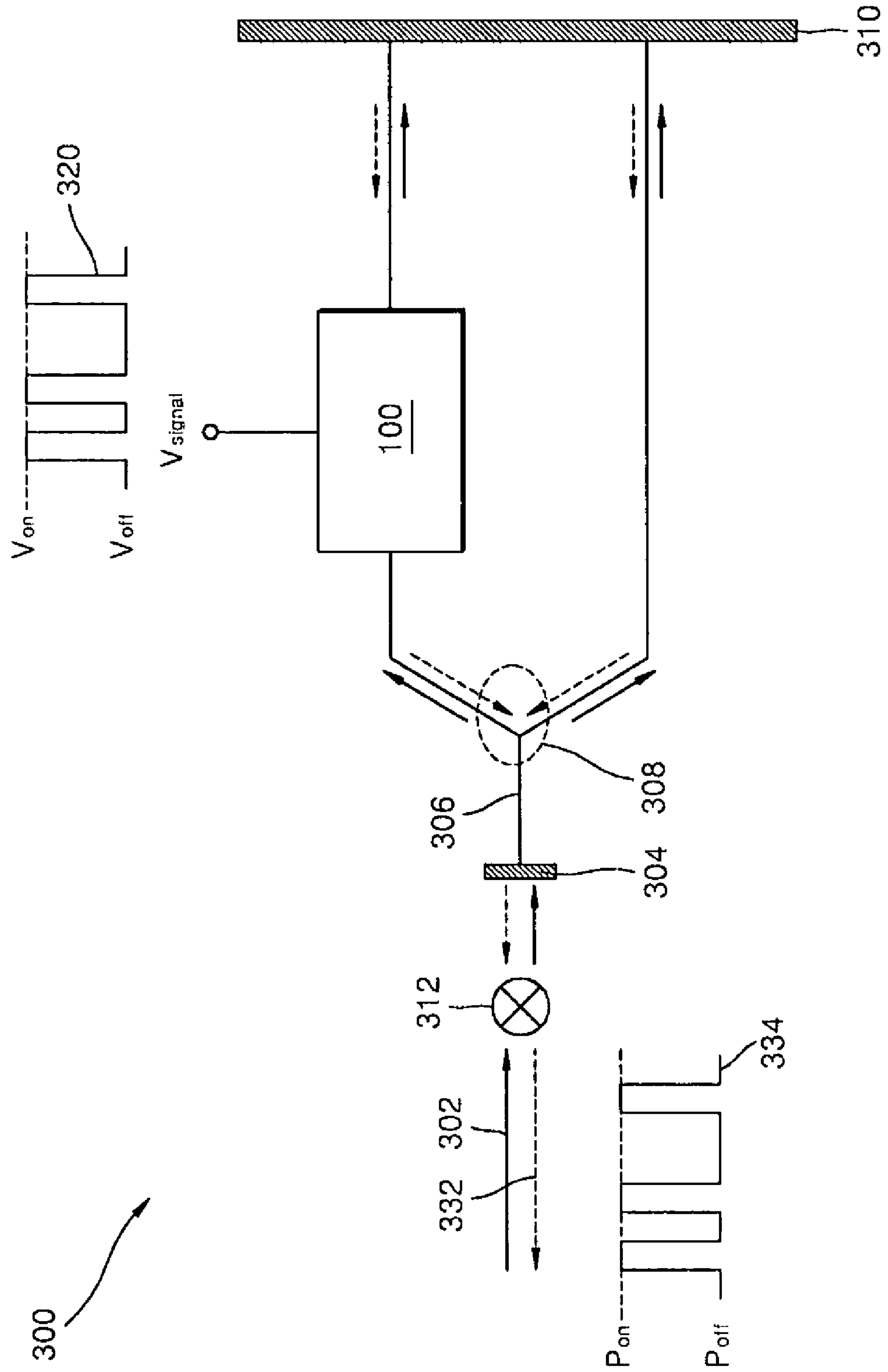
FIG. 11 is a schematic view of an optical modulator having a Michelson structure including the optical device of the present invention.

FIG. 11 is a schematic view of an optical modulator having a Michelson structure 300 (or Michelson interferometer) including the optical device of the present invention.

Referring to FIG. 11, the Michelson interferometer 300 includes a passive waveguide 306, a Y-optical intensity splitter 308, and a phase shifter 100. When a continuous beam 302 having continuous optical intensity is input to the passive waveguide 306, the continuous wave 302 is branched along two arms of the Michelson interferometer 300. A phase shifter 100 is installed in at least one of the two arms to modulate the phase of beams by a modulated applied voltage 320. The phase-shifted beam is reflected on the facet which is cleaved or deposited with a high reflection film 310 to shift the phase of beams again. Then, optical signals 332 and 334 with modulated optical intensity are output by destructive or constructive interference in the Y-optical intensity combiner 308. A circulator 312 may be further included to separate the input continuous beam 302 and the modulated optical signals 332 and 334.

Since the cleaved facet of the passive waveguide 306 is reflected due to air and the difference of the refractive index, the input passive waveguide 306 is deposited with an anti-reflection film 304. In addition, in order to reduce more the reflection of the input and output passive waveguide 306, the anti-reflection film 304 may be inclined toward the facet of the passive waveguide 306.

Meanwhile, the Y-optical intensity splitter 208 or 306 and the Y-optical intensity combiner 210 of FIGS. 10 and 11 may be replaced with a direction coupler or a multimode intensity coupler (MMI coupler).

Figure 12:
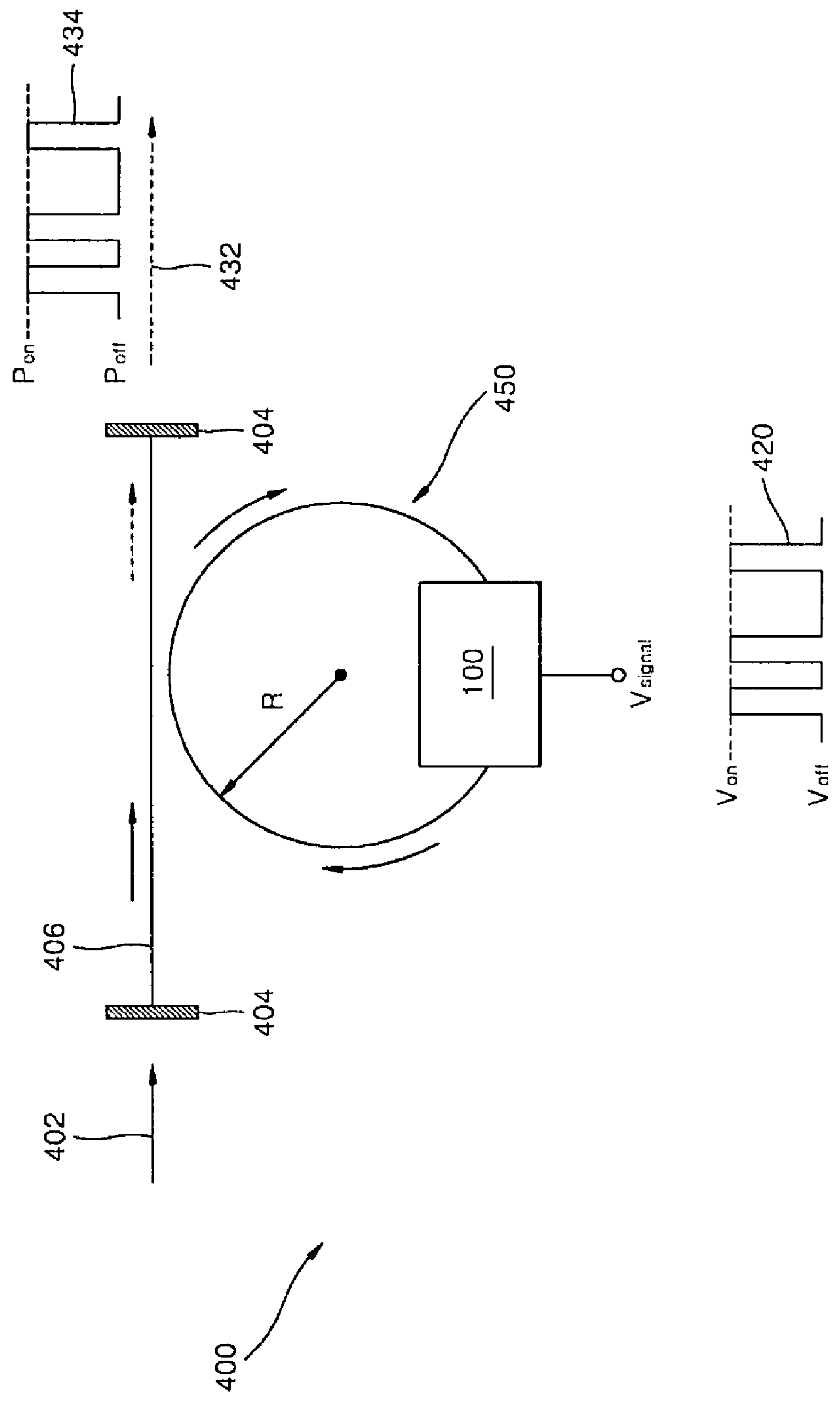
FIG. 12 is a schematic view of an optical modulator having a structure of an optical resonator including the optical device of the present invention.

FIG. 12 is a schematic view of an optical modulator 400 having a structure of a ring resonator and including a phase shifter of the present invention.

Referring to FIG. 12, the optical modulator 400 includes a passive waveguide 406 and a phase shifter 100 installed in a ring resonator 450. A continuous beam 402 is input to the passive waveguide 406 and combined in the ring resonator 450. The relationship between the input wavelength $\lambda_0$ of the continuous beam 402 that is combined in the ring resonator 450 and the ring resonator 450 is expressed by Equation (11) below:

$$\lambda_o = \frac{n_{eff}\cdot 2\pi R}{m}, \qquad \text{Equation (11)}$$

where $\lambda_0$ is a resonation wavelength without an applied voltage, $n_{eff}$ is an effective refractive index of the passive waveguide 406, R is radius of the ring resonator 450, and m is an integer (m=1, 2, 3 . . . ).

When a voltage is input to the phase shifter 100 included in the ring resonator 450, the effective refractive index varies. When the effective refractive index is varied, the input wavelength $1_o$ of the continuous beam 402 is not combined in the ring resonator 450 and the continuous beam 402 is output to the passive waveguide 406. In this manner, optical signals 432 and 434 modulated according to the applied voltage are output.

Since the continuous beam 402 is reflected from the cleaved facet of the passive waveguide 406 due to air and the difference of the refractive index, the passive waveguide 406 may be deposited with an anti-reflection film 404. In addition, in order to reduce more the reflection of the passive waveguide 406, the anti-reflection film 404 may be inclined toward the facet of the passive waveguide 406. The optical modulator 400 having the ring resonator structure may be a variable optical filter.

Figure 13:
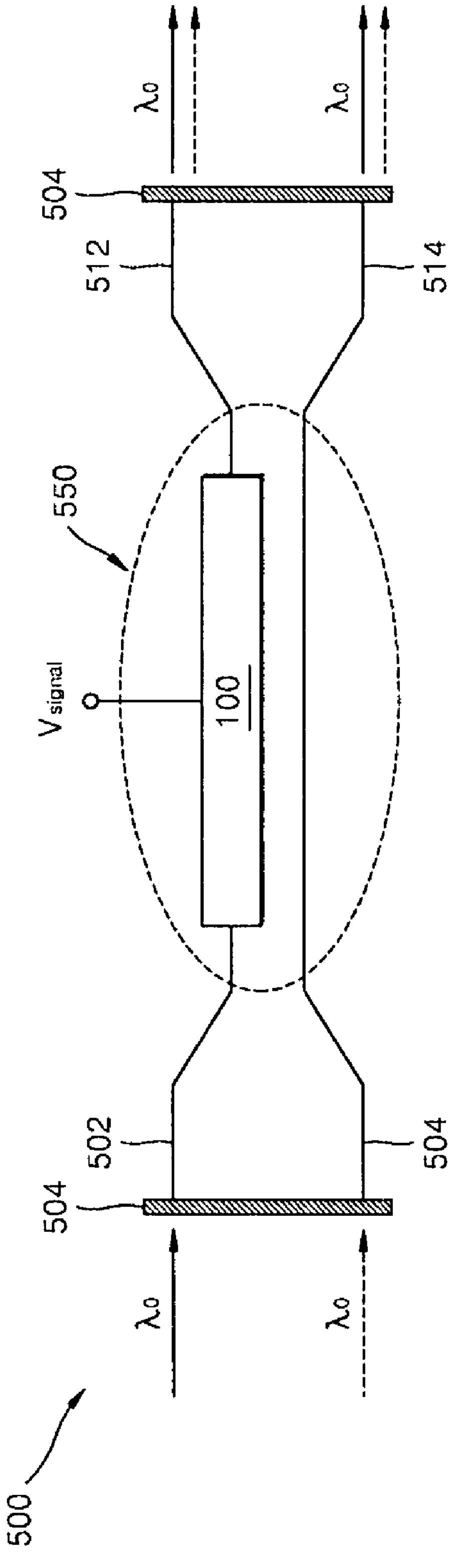
FIG. 13 is a schematic view of an optical switch including the optical device of the present invention.

FIG. 13 is a schematic view of an optical switch 500 including a phase shifter of the present invention.

Referring to FIG. 13, the optical switch 500 includes a pair of input passive waveguides 502 and 504, a phase shifter 100 installed in at least one of the input passive waveguides 502 and 504, and output passive waveguides 512 and 514. Optical signals $\lambda_0$ incident on the input passive waveguides 502 and 504 pass through the direction combiner 550 including the phase shifter 100 included and then are output to the output passive waveguides 512 and 514.

The ratio of the light combined in the adjacent input passive waveguide 504 from the passive waveguide 502 including the phase shifter 100 can be adjusted by the variation of the effective refractive index according to a voltage applied to the phase shifter 100 included in the direction combiner 550 as a ring resonator. The optical switch 500 may be used in a variable optical filter, an optical modulator, etc.

Figure 14:
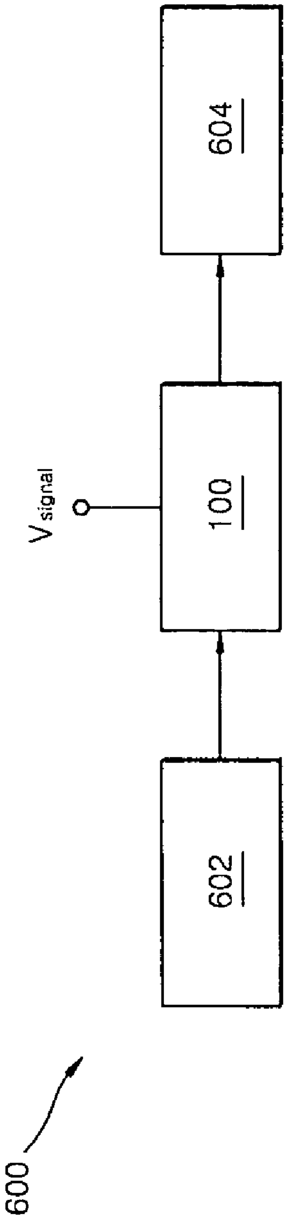
FIG. 14 is a schematic view of an optical attenuator including the optical device of the present invention.

FIG. 14 is a schematic view of an optical device 600 including an optical attenuator.

Referring to FIG. 14, the optical device 600 includes an optical transmitter 602, the optical attenuator 100 of the present invention, and an optical receiver 604. Optical signals generated in the optical transmitter 602 are transmitted to the optical receiver 604 using the variable optical attenuator 100 and their static or dynamic optical intensity is adjusted.

Figure 15:
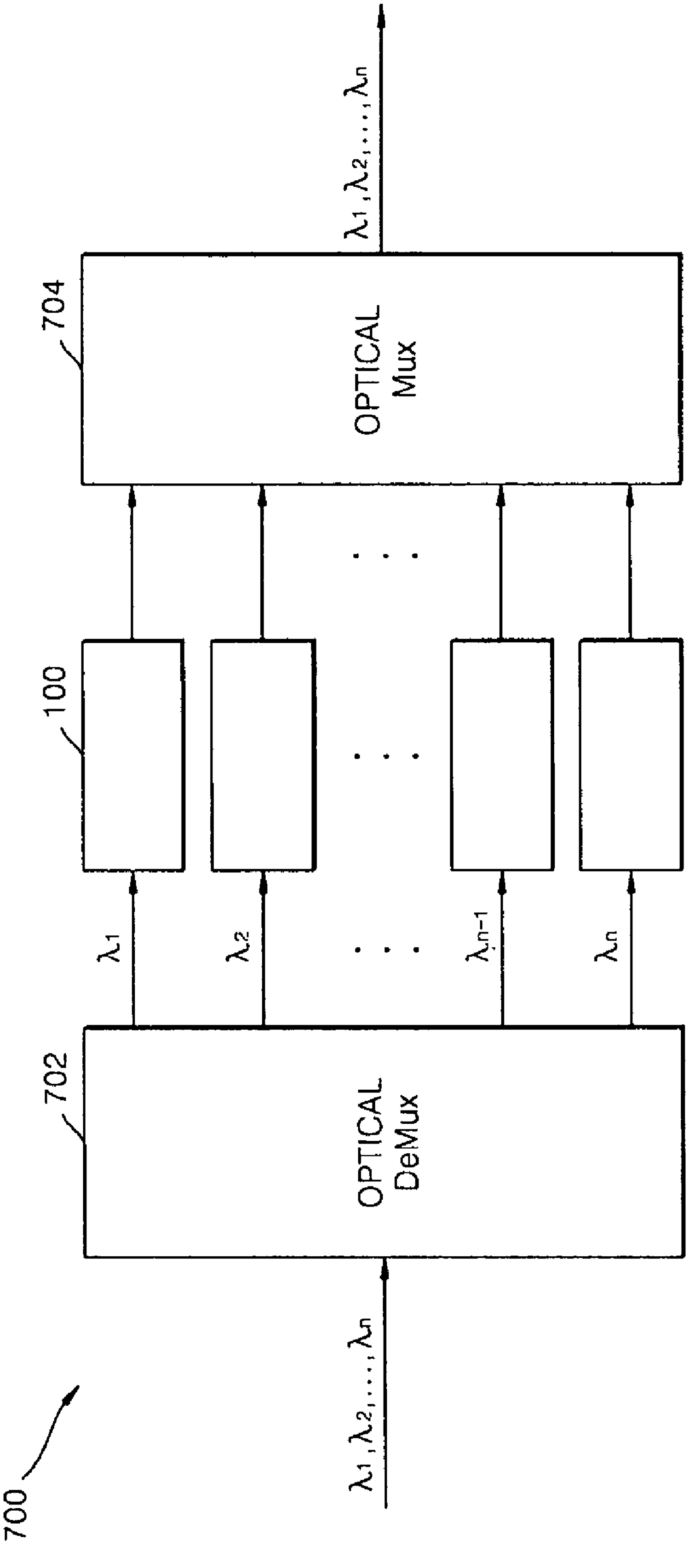
FIG. 15 is a schematic view of a multi-channel optical modulator having a flat output and including the optical device of the present invention.

FIG. 15 is a schematic view of a multi-channel optical modulator 700 having a flat output and including an optical attenuator of the present invention.

Referring to FIG. 15, the multi-channel optical modulator 700 is an apparatus for adjusting the output intensity equivalent to the multi-channel wavelength having different optical intensities. The multi-channel optical modulator 700 includes a plurality of variable optical attenuators 100 in a predetermined arrangement and optical demux and mux 702 and 704, which are connected to the input portion and the output portion of each of the optical attenuators 100. Multiple wavelengths having different optical intensities in an optical fiber or an optical passive waveguide are separated for each channel using the optical demux 702. Then, the optical intensity is adjusted using the variable optical attenuator 100, and then can be transmitted to the optical fiber or the optical passive waveguide using the variable optical attenuators 100.

The passive waveguide according to the present invention may be formed of at least one material selected from the group consisting of a semiconductor material such as Si-based, GaAs-based, InP-based, GaN-based, ZnO-based material, etc., polymer, lithium niobate, and optical fiber. Also, the passive waveguide, the optical demux or optical mux, the variable optical attenuator or the phase shifter may be monolithically integrated on a substrate using a Si-based, InP-based, GaN-based, or GaAs-based material.

The optical device including a gate insulating layer having a modulated thickness according to the present invention increases the optical confinement factor of a charged layer around the gate insulating layer by varying the thickness of the gate insulating layer in a horizontal direction compared to a flat gate insulating layer having the same capacitance, thereby improving the variation of the refractive index and the optical attenuation effect without decreasing the dynamic characteristics.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. An optical device comprising:

a semiconductor substrate;

an insulator disposed over the semiconductor substrate;

a first semiconductor layer which is formed over the insulator, is doped with first impurities of a first conductivity type, and has a substantially uniform thickness;

a gate insulating layer which has a U-shape and is formed over a portion of the first semiconductor layer and has a center portion that is thinner than first and second side portions of the gate insulating layer;

a second semiconductor layer which covers an upper surface of the gate insulating layer and is doped with second impurities of a second conductivity type being different from the first conductivity type; and a current blocking layer that contacts both sides of the gate insulating layer and is interposed between the first semiconductor layer and the second semiconductor layer to block currents, wherein the thickness of the current blocking layer is thicker than the gate insulating layer.

2. The optical device of claim 1, wherein the optical device uses a phase shift by a variation of a refractive index ($\Delta n$) according to an increase of an optical confinement factor of the center portion of the gate insulating layer.

3. The optical device of claim 2, wherein the device is a MachZehnder interferometer type optical modulator.

4. The optical device of claim 2, wherein the device is a Michelson type optical modulator.

5. The optical device of claim 2, wherein the device is a ring resonator type optical modulator.

6. The optical device of claim 2, wherein the device is an optical switch.

7. The optical device of claim 2, wherein the device a variable optical filter.

8. The optical device of claim 1, wherein the optical device uses an optical attenuation effect by a variation of an absorption ratio ($\Delta\alpha$) according to an increase of an optical confinement factor of the center portion of the gate insulating layer.

9. The optical device of claim 8, wherein the device is a multi-channel equalizer.

10. The optical device of claim 1, further comprising at least one ohmic layer, which is doped with high density impurities, over an upper portion of the first semiconductor layer for an ohmic contact.

11. The optical device of claim 1, wherein the first and the second semiconductor layers are doped entirely uniformly or partially with different doping densities.

12. The optical device of claim 1, wherein a refractive index of the gate insulating layer is smaller than a refractive index of the first and the second semiconductor layer.

13. The optical device of claim 1, wherein a ratio of a width of the center portion of the gate insulating layer with respect to a width of the gate insulating layer is 0.10 to 0.90.

14. The optical device of claim 1, wherein the gate insulating layer comprising:

a first insulating layer separated apart while leaving a center portion empty; and a second insulating layer formed in the center portion of first semiconductor layer.

15. The optical device of claim 14, wherein the first and the second insulating layers are formed of an identical material or different materials.

16. The optical device of claim 1, wherein the gate insulating layer is formed of any material selected from the group consisting of SiO2, H2fO, SiNx, SiNxOy, ferroelectric material, and a combination of these materials.

* * * * *